US007034627B1

(12) United States Patent
Kudari

(10) Patent No.: US 7,034,627 B1
(45) Date of Patent: Apr. 25, 2006

(54) OSCILLATOR CIRCUIT WITH VARIABLE REFERENCE VOLTAGE AND CURRENT

(75) Inventor: Anand D. Kudari, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 54 days.

(21) Appl. No.: 10/816,292

(22) Filed: Apr. 1, 2004

(51) Int. Cl.
*H03K 3/02* (2006.01)

(52) U.S. Cl. ............... 331/143; 331/111; 331/175; 331/177 R; 331/176

(58) Field of Classification Search ........... 331/177 R, 331/175, 176, 111, 143
See application file for complete search history.

(56) References Cited

U.S. PATENT DOCUMENTS 6,157,270 A * 12/2000 Tso ................. 331/176

OTHER PUBLICATIONS

Flynn, Michael P., and Lidholm, Sverre U., "A 1.2-μm CMOS Current-Controlled Oscillator," *IEEE Journal of Solid-State Circuits*, vol. 27, No. 7, Jul. 1992, pp. 982–987.

* cited by examiner

*Primary Examiner*—Arnold Kinkead
(74) *Attorney, Agent, or Firm*—Darby & Darby PC; Matthew M. Gaffney

(57) ABSTRACT

A relaxation oscillator circuit is configured to provide an output signal. The relaxation oscillator circuit includes two capacitors that are alternatively charged and discharged. Each capacitor is charged by a separate current that is provided by mirroring a reference current. The reference current for the current mirror may be provided by a bias circuit such that the reference current may vary significantly over temperature and supply voltage. Also, the reference current is mirrored to a resistor to provide the reference voltage. The resistor has a temperature coefficient that is substantially zero. Accordingly, the output signal is relatively independent of temperature and supply voltage, even though the reference current and the reference voltage may vary significantly over temperature and supply voltage.

16 Claims, 4 Drawing Sheets

US 7,034,627 B1

OSCILLATOR CIRCUIT WITH VARIABLE REFERENCE VOLTAGE AND CURRENT

FIELD OF THE INVENTION

The invention is related to oscillators, and in particular, to a relaxation oscillator circuit that employs a variable reference voltage and current.

BACKGROUND OF THE INVENTION

Oscillator circuits are used in computers, computer peripherals, counters, timers, calculators, phase-locked loops, digital multimeters, oscilloscopes, and numerous other applications. An oscillator circuit may be used to provide a clock signal, to produce an accurate waveform, and the like.

A type of oscillator circuit referred to as a relaxation oscillator generally operates as follows. The relaxation oscillator charges a capacitor with a reference current, and discharges the capacitor rapidly if the capacitor voltage reaches a reference voltage. The charging and discharging of the capacitor generates a sawtooth waveform that is used to generate the output signal. Alternatively, the polarity of the current may be reversed when the reference voltage is reached, generating a triangle waveform rather than a sawtooth waveform.

Also, the reference voltage is typically provided by a bandgap reference, so that the reference voltage is substantially independent of temperature and supply voltage. The current used to charge the capacitor is also typically substantially independent of temperature and supply voltage. In this way, the oscillator frequency can be substantially independent of variations in temperature and supply voltage.

BRIEF DESCRIPTION OF THE DRAWINGS

Non-limiting and non-exhaustive embodiments of the present invention are described with reference to the following drawings, in which.

DETAILED DESCRIPTION

Figure 1:
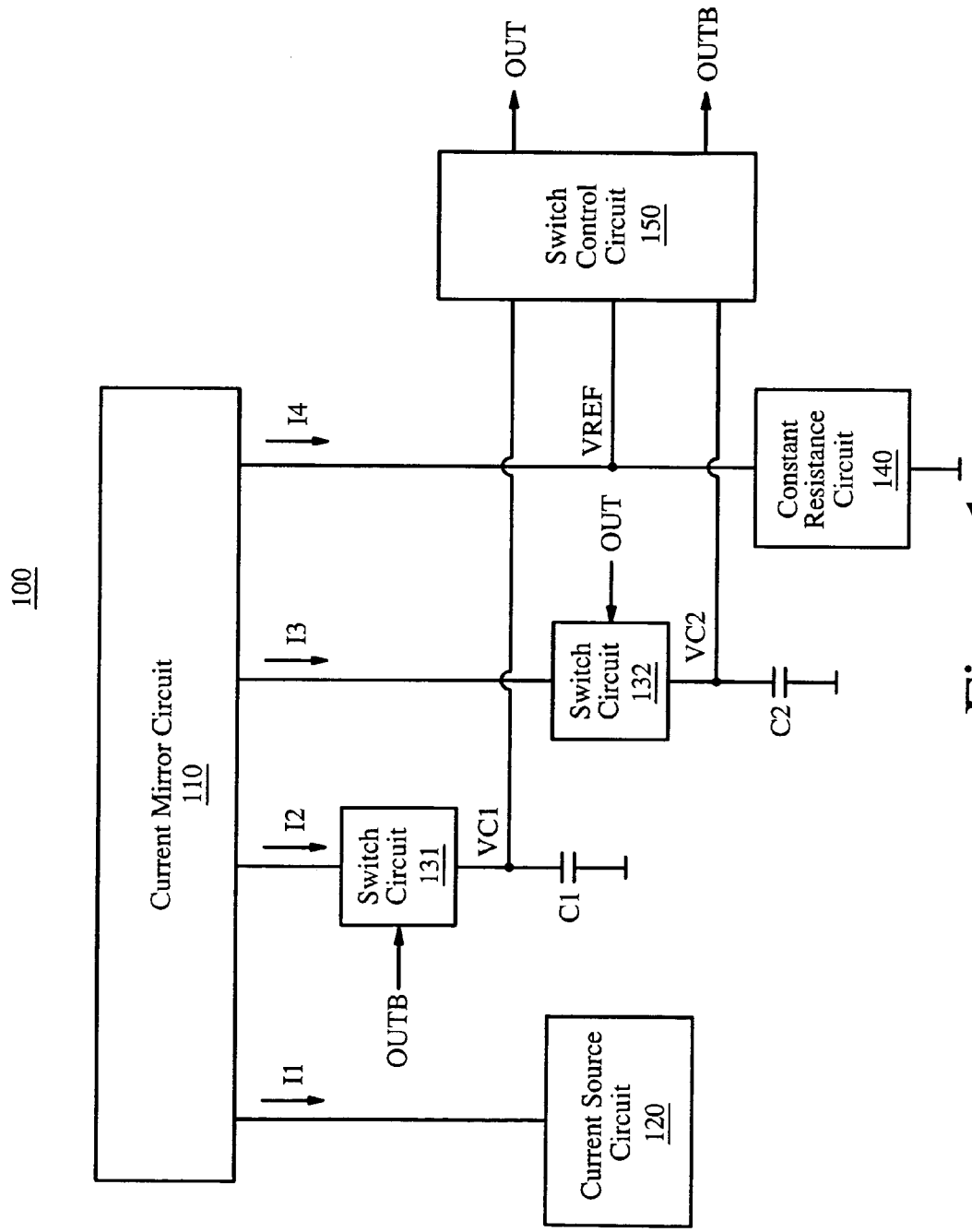
FIG. 1 shows a block diagram of an embodiment of an oscillator circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The term "connected" means a direct electrical connection between the items connected, without any intermediate devices. The phrase "in one embodiment," as used herein does not necessarily refer to the same embodiment, although it may. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, a relaxation oscillator circuit is configured to provide an output signal. The relaxation oscillator circuit includes two capacitors that are alternatively charged and discharged. Each capacitor is charged by a separate current that is provided by mirroring a reference current. The reference current for the current mirror may be provided by a bias circuit such that the reference current may vary significantly over temperature and supply voltage. Also, substantially the same reference current is mirrored to a resistor to provide the reference voltage. The resistor has a temperature coefficient that is substantially zero. Accordingly, the output signal is relatively independent of temperature and supply voltage, even though the reference current and the reference voltage may vary substantially over temperature and supply voltage.

FIG. 1 shows a block diagram of an embodiment of oscillator circuit 100. Oscillator circuit 100 includes components such as current mirror circuit 110, current source circuit 120, switch circuits 131–132, capacitors C1–C2, constant resistance circuit 140, and switch control circuit 150.

In operation, current source circuit 120 provides reference current I1. Current mirror circuit 110 is configured to provide currents I2, I3, and I4 from reference current I1. Also, the currents I2 and I3 are configured to be substantially equal to each other.

Also, switch circuit 131 and capacitor C1 are arranged such that capacitor C1 is charged by current I2 if an output signal (OUT) corresponds to a first logic level, and discharged if signal OUT corresponds to a second logic level. Conversely, switch circuit 132 and capacitor C2 are arranged such that capacitor C2 is charged by current I3 if signal OUT corresponds to a second logic level, and discharged if signal OUT corresponds to a first logic level. Further, capacitor C1 is arranged to provide signal VC1, and capacitor C2 is arranged to provide signal VC2.

Additionally, constant resistance circuit 140 is configured to provide reference voltage VREF from current I4. More specifically, constant resistance circuit 140 is configured to provide VREF such that VREF=I4*R0, and such that R0 is substantially independent of temperature and supply voltage.

Because R0 is substantially independent of temperature and supply voltage, reference voltage VREF tracks any variations in current I4 that result from changes in temperature and supply voltage.

In one embodiment, current source circuit 120 is a variable current source circuit. In this embodiment, current I1 can vary significantly over temperature and supply voltage.

Also, switch control circuit 150 is configured to provide output signal OUT and an inverse of signal OUT (OUTB) from signals VC1, VC2, and VREF. Further, circuit 100 is arranged such that signal OUT is substantially independent of supply voltage and temperature, regardless of whether reference current I1 varies with supply voltage and/or temperature.

Figure 2:
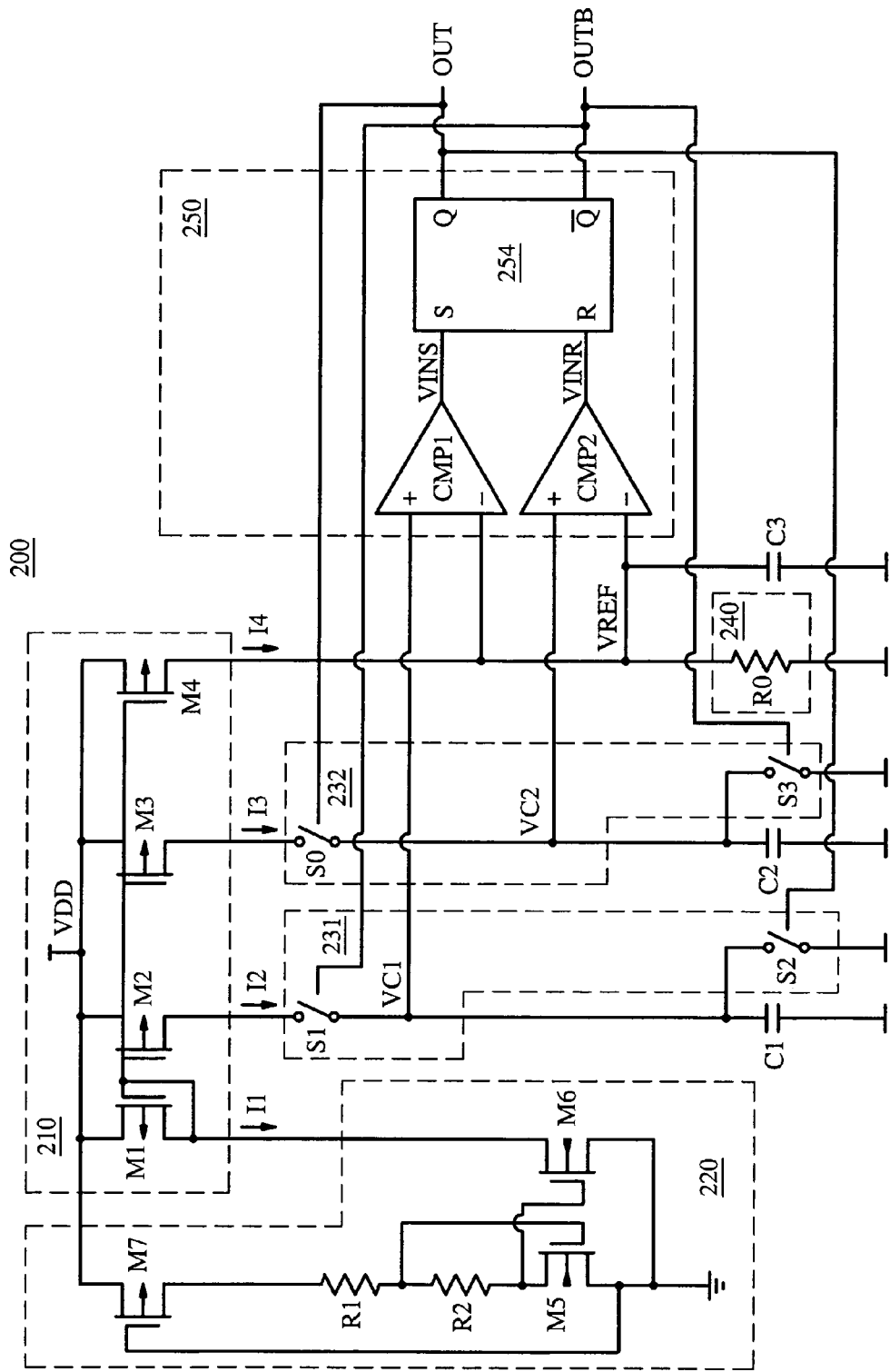
FIG. 2 schematically illustrates an oscillator circuit that is an embodiment of the oscillator circuit of FIG. 1.

FIG. 2 schematically illustrates an embodiment of oscillator circuit 200. Components in oscillator circuit 200 may operate in a similar manner to similarly-named components in oscillator circuit 100, and may operate in a different manner in some ways. Oscillator circuit 200 includes current mirror circuit 210, variable current source circuit 220, switch circuits 231–232, capacitors C1–C2, constant resistance circuit 240, and switch control circuit 250. Oscillator circuit 200 may also include capacitor C3. An embodiment of current mirror circuit 210 includes transistors M1–M4. Also, an embodiment of current source circuit 220 includes transistor M5–M7 and resistors R1–R2. An embodiment of switch circuit 231 includes switches S1–S2. Similarly, an embodiment of switch circuit 232 includes switches S0 and S3. An embodiment of constant resistance circuit 240 includes resistor R0. In addition, an embodiment of switch control circuit 250 includes comparators CMP1–CMP2 and SR latch 254.

In operation, variable current source circuit 220 provides reference current I1. More specifically, variable current source circuit 220 is configured to provide reference current I1 such that reference current I1 varies significantly over temperature and supply voltage (VDD). Also, resistors R1 and R2 may be pre-selected to provide the desired amount of current for reference current I1.

Figure 3:
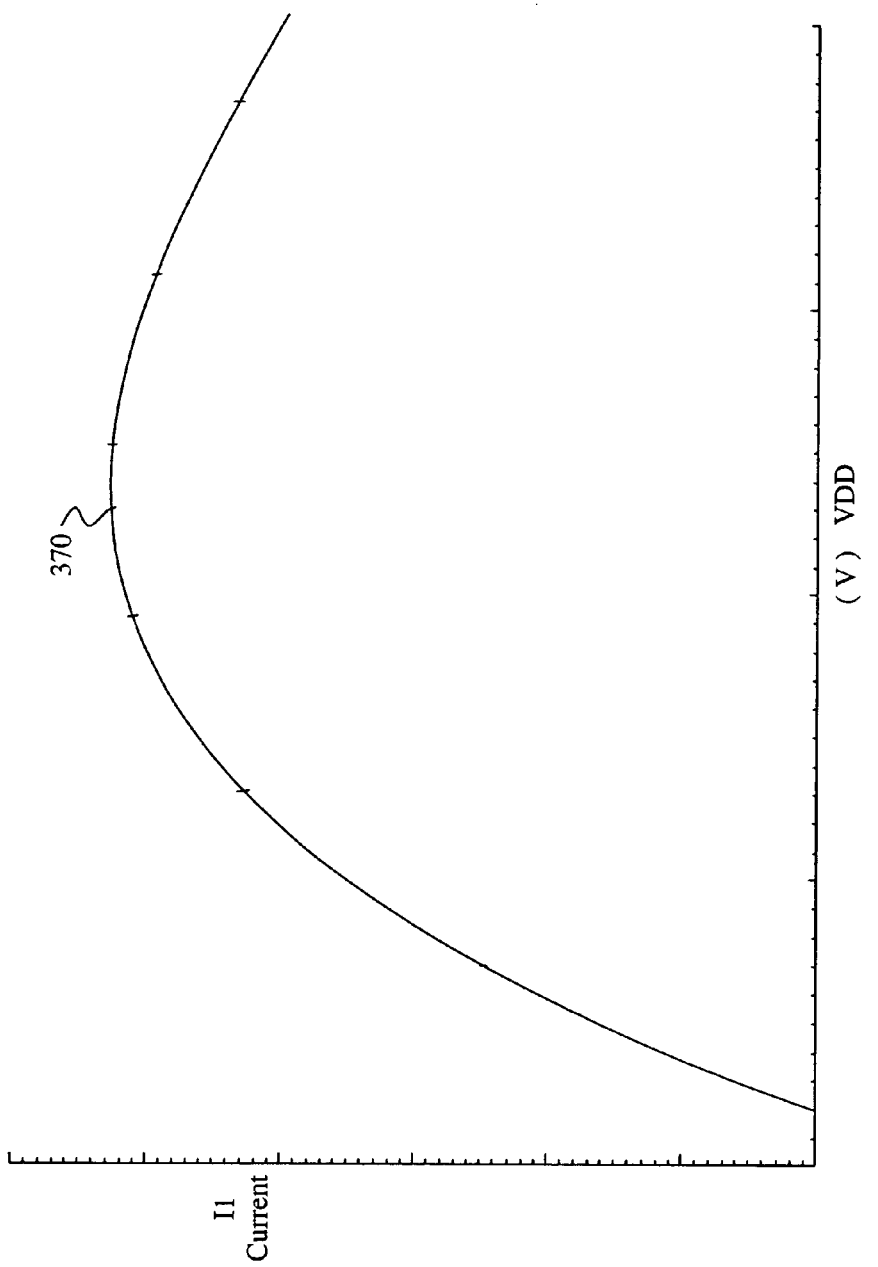
FIG. 3 shows a waveform of an embodiment of the reference current of FIG. 2.

FIG. 3 shows an embodiment of a waveform (370) of an embodiment of current I1. As shown, current I1 varies significantly with supply voltage (VDD). In one embodiment, current I1 varies from approximately 1.7 µA to 2.3 µA over a range of approximately 2.2V to 6.0V for VDD.

Referring back to FIG. 2, current mirror 210 is configured to provide currents I2–I4 from current I1. Accordingly, currents I2–I4 also vary significantly with temperature and supply voltage (VDD).

Also, capacitor C1 and switches S1 and S2 are arranged to provide voltage VC1 as follows. If signal OUT is low, switch S1 is closed and switch S2 is open, which causes capacitor C1 to charge. This in turn causes voltage VC1 to increase linearly at a rate of approximately I2/C1. Conversely, if signal OUT is high, switch S1 is open and switch S2 is closed, which causes capacitor C1 to discharge. This in turn causes voltage VC1 to return to approximately zero volts.

Similarly, Capacitor C2 and switches S0 and S3 are arranged to provide voltage VC2 as follows. If signal OUT is high, switch S0 is closed and switch S3 is open, which causes capacitor C2 to charge. This in turn causes voltage VC2 to increase linearly at a rate of approximately I3/C2. Conversely, if signal OUT is low, switch S0 is open and switch S3 is closed, which causes capacitor C2 to discharge. This in turn causes signal VC2 to return to return to approximately zero volts.

Additionally, resistor R0 is configured to provide signal VREF from current I4 such that VREF=I4*R0. Further, resistor R0 is configured to have a resistance that is substantially constant regardless of temperature and supply voltage.

Resistor R0 has a temperature coefficient of substantially zero. In one embodiment, resistor R0 is a series combination of two or more different types of resistors having different temperature coefficients. In one embodiment, resistor R0 includes a series combination of two resistors, the first having a positive temperature coefficient, and the second having a negative temperature coefficient. In one embodiment, resistor R0 includes poly-silicon having a positive temperature coefficient, and high-resistance poly-silicon having a negative temperature coefficient. Preferably, the resistance of resistor R0 is selected such that VREF remains substantially within the supply voltage rails.

Also, one embodiment of switch control circuit 250 is arranged to operate as follows. Comparator CMP1 is configured to compare voltages VC1 and VREF, and to provide signal VINS in response to the comparison. Similarly, comparator CMP2 is configured to compare voltages VC2 and VREF, and to provide signal VINR in response to the comparison. SR latch 254 is configured to provide signals OUT and OUTB from signals VINS and VINR. Although one embodiment of switch control circuit 250 is discussed, other embodiments are within the scope of the invention. In one embodiment, SR latch 254 may be replaced with another circuit, such as a different type of latch, a flip-flop, and the like. In one embodiment, the two comparators and the latch may be with a double-differential latching comparator or with two latching comparators.

Additionally, capacitor C3 is an optional component of oscillator circuit 200. Capacitor C3 may prevent fast transients in voltage VREF.

Figure 4:
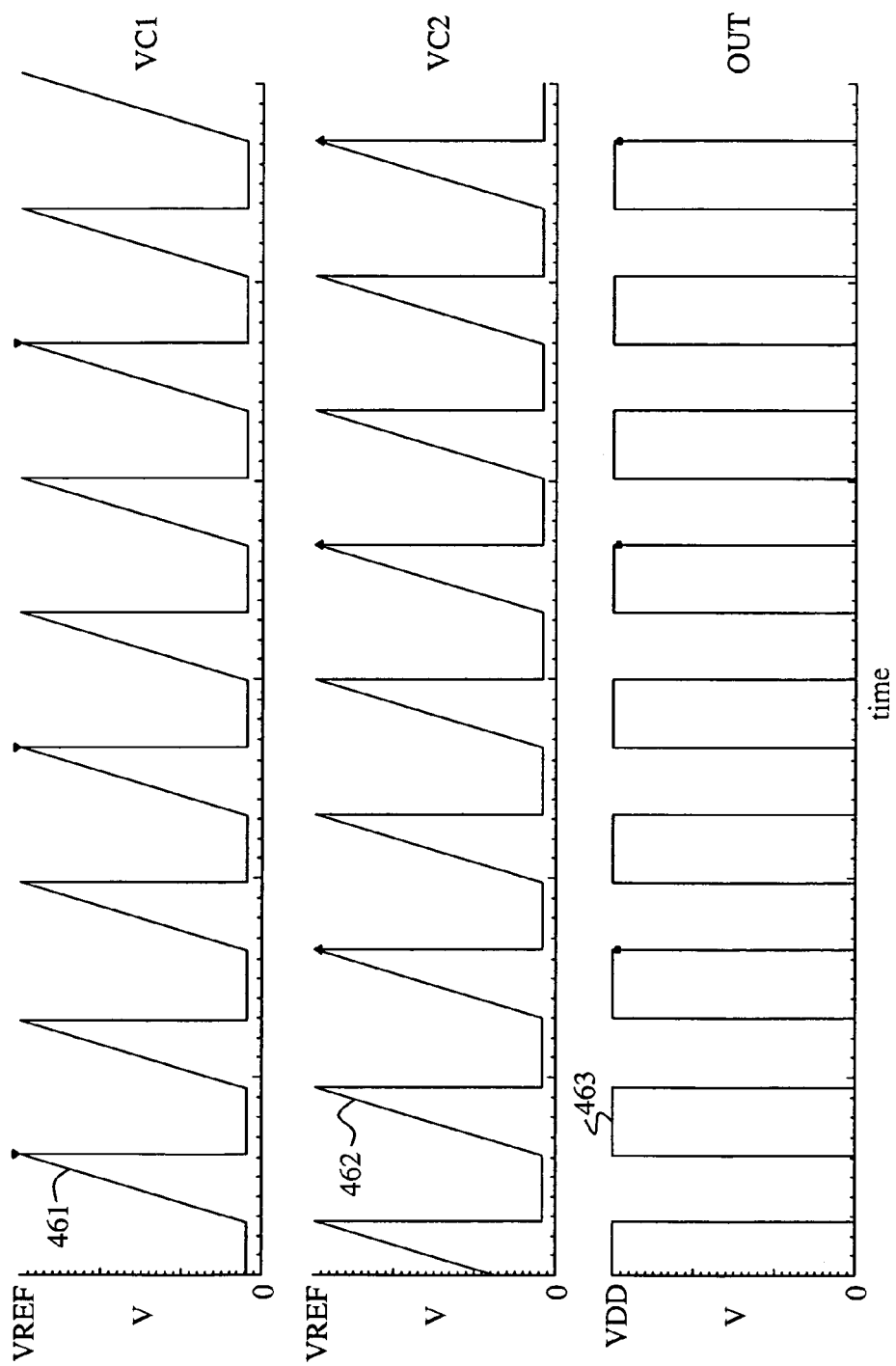
FIG. 4 illustrates a timing diagram of waveforms of embodiments of signals from the oscillator circuit of FIG. 2, in accordance with aspects of the invention.

FIG. 4 illustrates a timing diagram of waveforms of embodiment of signals VC1, VC2, and OUT for oscillator circuit 200. As shown in FIG. 4, if signal OUT is high, voltage VC2 ramps upwards until voltage VC2 reaches voltage VREF. When this happens, comparator CMP2 asserts signals VINR, which resets SR latch 254. This in turn change signal OUT to change to low. When this happens, voltage VC2 is reduced to substantially zero, and voltage VC1 beings ramping upwards. Voltage VC1 ramps upwards until voltage VC1 reaches voltage VREF. When this happens, comparator CMP1 asserts signal VINS, which sets SR latch 254. This in turns changes signal OUT to high. When this happens, voltage VC2 begins ramping upwards again.

In one embodiment, C1 is substantially equal to C2. In this embodiment, the frequency of oscillation f associated with signal OUT is substantially given by $f=I1/(2*C*VREF)$, where $C=C1=C2$. Accordingly, $f=1/(2*R0*C*k)$, where k is the mirror ratio between transistors M3 and M4.

Accordingly, the frequency of oscillation associated with signal OUT depends on R0 and C. The frequency of oscillation is substantially independent of supply voltage and temperature.

Preferably, comparators CMP1 and CMP2 are each configured to perform their respective comparisons within a time interval of 1% of the desired period of oscillation or less.

The above specification, examples and data provide a description of the manufacture and use of the composition of the invention. Since many embodiments of the invention can be made without departing from the spirit and scope of the invention, the invention also resides in the claims hereinafter appended.

The invention claimed is:
1. An oscillator circuit, comprising:
  a variable current source that is arranged to provide a reference current, wherein the reference current is dependent on at least one of temperature and a supply voltage;
  a current mirror that is coupled to the variable current source and operable to mirror the reference current source across a resistive element to produce a reference voltage wherein a value of the resistive element is relatively independent of temperature;

a switch circuit that is coupled between the current mirror and a capacitive circuit, wherein the switch circuit is operable to periodically charge and discharge the capacitive circuit; and a switch control circuit that is coupled to the reference voltage and coupled to the capacitive circuit, wherein the periodic charging and discharging of the capacitive circuit is employed by the switch control circuit to provide an oscillating output signal that is relatively independent of a change in temperature and a change in the supply voltage, wherein the switch circuit further comprises a switch element that is coupled between the capacitive circuit and the current mirror and another switch element that is coupled between the capacitive circuit and ground.

2. An oscillator circuit, comprising:

a variable current source that is arranged to provide a reference current, wherein the reference current is dependent on at least one of temperature and a supply voltage;

a current mirror that is coupled to the variable current source and operable to mirror the reference current across a resistive element to produce a reference voltage, wherein a value of the resistive element is relatively independent of temperature;

a switch circuit that is coupled between the current mirror and a capacitive circuit wherein the switch circuit is operable to periodically charge and discharge the capacitive circuit; and a switch control circuit that is coupled to the reference voltage and coupled to the capacitive circuit wherein the periodic charging and discharging of the capacitive circuit is employed by the switch control circuit to provide an oscillating output signal that is relatively independent of a change in temperature and a change in the supply voltage, wherein the capacitive circuit further comprises a first capacitive element and a second capacitive element, wherein the first capacitive element is periodically charged and then discharged while a second capacitive element is periodically discharged and then charged by the switch circuit.

3. The oscillator circuit of claim 2, wherein a value of the first capacitive element is relatively equivalent to a value of the second capacitive element.

4. The oscillator of claim 2, wherein a value of the first capacitive element is relatively dissimilar to a value of the second capacitive element.

5. The oscillator of claim 2, wherein the switch control circuit further comprises a comparator that includes an input coupled to the reference voltage, wherein the first capacitive element is coupled to another input of the comparator and the second capacitive element is coupled to another input of the comparator.

6. The oscillator circuit of claim 2, wherein the switch control circuit further comprises a first comparator and a second comparator, wherein the reference voltage is coupled to an input of the first comparator and an input of the second comparator, and wherein the first capacitive element is coupled to another input of the first comparator and the second capacitive element is coupled to another input of the second comparator.

7. An oscillator circuit, comprising:

a variable current source that is arranged to provide a reference current wherein the reference current is dependent on at least one of temperature and a supply voltage;

a current mirror that is coupled to the variable current source and operable to mirror the reference current across a resistive element to produce a reference voltage, wherein a value of the resistive element is relatively independent of temperature;

a switch circuit that is coupled between the current mirror and a capacitive circuit, wherein the switch circuit is operable to periodically charge and discharge the capacitive circuit; and a switch control circuit that is coupled to the reference voltage and coupled to the capacitive circuit, wherein the periodic charging and discharging of the capacitive circuit is employed by the switch control circuit to provide an oscillating output signal that is relatively independent of a change in temperature and a change in the supply voltage, wherein the switch control circuit further comprises a latch.

8. An oscillator circuit, comprising:

a variable current source that is arranged to provide a reference current, wherein the reference current is dependent on at least one of temperature and a supply voltage;

a current mirror that is coupled to the variable current source and operable to mirror the reference current across a resistive element to produce a reference voltage, wherein a value of the resistive element is relatively independent of temperature;

a switch circuit that is coupled between the current mirror and a capacitive circuit, wherein the switch circuit is operable to periodically charge and discharge the capacitive circuit; and a switch control circuit that is coupled to the reference voltage and coupled to the capacitive circuit, wherein the periodic charging and discharging of the capacitive circuit is employed by the switch control circuit to provide an oscillating output signal that is relatively independent of a change in temperature and a change in the supply voltage, wherein the switch control circuit further comprises a flip-flop.

9. An oscillator circuit, comprising:

a variable current source that is arranged to provide a reference current, wherein the reference current is dependent on at least one of temperature and a supply voltage;

a current mirror that is coupled to the variable current source and operable to mirror the reference current across a resistive element to produce a reference voltage, wherein a value of the resistive element is relatively independent of temperature;

a switch circuit that is coupled between the current mirror and a capacitive circuit, wherein the switch circuit is operable to periodically charge and discharge the capacitive circuit; and a switch control circuit that is coupled to the reference voltage and coupled to the capacitive circuit, wherein the periodic charging and discharging of the capacitive circuit is employed by the switch control circuit to provide an oscillating output signal that is relatively independent of a change in temperature and a change in the supply voltage, wherein a capacitive element is coupled between ground and the reference voltage coupled to the switch control circuit.

10. An oscillator circuit, comprising:

a variable current source that is arranged to provide a reference current, wherein the reference current is dependent on at least one of temperature and a supply voltage;

a current mirror that is coupled to the variable current source and operable to mirror the reference current across a resistive element to produce a reference voltage, wherein a value of the resistive element is relatively independent of temperature;

a switch circuit that is coupled between the current mirror and a capacitive circuit, wherein the switch circuit is operable to periodically charge and discharge the capacitive circuit; and a switch control circuit that is coupled to the reference voltage and coupled to the capacitive circuit, wherein the periodic charging and discharging of the capacitive circuit is employed by the switch control circuit to provide an oscillating output signal that is relatively independent of a change in temperature and a change in the supply voltage, wherein the oscillating output signal further comprises a frequency that is determined at least in part by a combination of a value of the resistive element and a value of the capacitive circuit.

11. An oscillator circuit, comprising:

a variable current source that is arranged to provide a reference current, wherein the reference current is dependent on at least one of temperature and a supply voltage;

a current mirror that is coupled to the variable current source and operable to mirror the reference current across a resistive element to produce a reference voltage, wherein a value of the resistive element is relatively independent of temperature;

a switch circuit that is coupled between the current mirror and a capacitive circuit, wherein the switch circuit is operable to periodically charge and discharge the capacitive circuit; and a switch control circuit that is coupled to the reference voltage and coupled to the capacitive circuit, wherein the periodic charging and discharging of the capacitive circuit is employed by the switch control circuit to provide an oscillating output signal that is relatively independent of a change in temperature and a change in the supply voltage, wherein the resistive element includes at least a relatively high resistance poly-silicon element with a temperature coefficient that is relatively equivalent to about zero.

12. An oscillator circuit, comprising:

a variable current source that is arranged to provide a reference current, wherein the reference current is dependent on at least one of temperature and a supply voltage;

a current mirror that is coupled to the variable current source and operable to mirror the reference current across a resistive element to produce a reference voltage, wherein a value of the resistive element is relatively independent of temperature;

a switch circuit that is coupled between the current mirror and a capacitive circuit, wherein the switch circuit is operable to periodically charge and discharge the capacitive circuit; and a switch control circuit that is coupled to the reference voltage and coupled to the capacitive circuit, wherein the periodic charging and discharging of the capacitive circuit is employed by the switch control circuit to provide an oscillating output signal that is relatively independent of a change in temperature and a change in the supply voltage, wherein the resistive element includes at least one resistor with a positive temperature coefficient and another resistor with a negative temperature coefficient, wherein a combined value for the positive temperature coefficient and the negative temperature coefficient is relatively equivalent to about zero.

13. An oscillator circuit, comprising:

a variable current source that is arranged to provide a reference current, wherein the reference current is dependent on at least one of temperature and a supply voltage;

a current mirror that is coupled to the variable current source and operable to mirror the reference current across a resistive element to produce a reference voltage, wherein a value of the resistive element is relatively independent of temperature;

a switch circuit that is coupled between the current mirror and a capacitive circuit, wherein the switch circuit is operable to periodically charge and discharge the capacitive circuit; and a switch control circuit that is coupled to the reference voltage and coupled to the capacitive circuit, wherein the periodic charging and discharging of the capacitive circuit is employed by the switch control circuit to provide an oscillating output signal that is relatively independent of a change in temperature and a change in the supply voltage, wherein the reference current is arranged to vary from about 1.7 microamps to 2.3 microamps over a supply voltage range of about 2.2 volts to 6.0 volts.

14. An oscillator circuit, comprising:

a variable current source that is arranged to provide a reference current, wherein the reference current is dependent on at least one of temperature and a supply voltage;

a current mirror that is coupled to the variable current source and operable to mirror the reference current across a resistive element to produce a reference voltage, wherein a value of the resistive element is relatively independent of temperature;

a switch circuit that is coupled between the current mirror and a capacitive circuit, wherein the switch circuit is operable to periodically charge and discharge the capacitive circuit; and a switch control circuit that is coupled to the reference voltage and coupled to the capacitive circuit, wherein the periodic charging and discharging of the capacitive circuit is employed by the switch control circuit to provide an oscillating output signal that is relatively independent of a change in temperature and a change in the supply voltage, wherein the switch control circuit further comprises a comparator for comparing the reference voltage to a voltage associated with the capacitive circuit, wherein the comparator operates in about one percent of a period that the capacitive circuit oscillates between charged and discharged.

15. An oscillator circuit, comprising:

a current mirror having at least an input, a first output, and a second output, wherein the second output of the current mirror is coupled to a resistor node;

a first switch circuit that is coupled between the first output of the current mirror and a capacitor node, wherein the oscillator circuit is arranged for operation with a capacitor coupled between the capacitor node and a ground node, and further arranged for operation with a temperature-independent resistor coupled to the resistor node;

a second switch circuit that is coupled between the capacitor node and the ground node; and a switch control circuit including a comparator, wherein the comparator has at least a first input, a second input, and an output; the comparator is operable to provide a comparator output signal at the output of the comparator based on a comparison of a voltage at the capacitor node with a voltage at the resistor node; the first input of the comparator is coupled to the capacitor node; the second input of the comparator is coupled to the resistor node; the switch control circuit is operable to control opening and closing of the first switch circuit and the second switch circuit; and wherein switch control circuit is operable to provide an oscillator output signal based, at least in part, on the comparator output signal.

16. The oscillator circuit of claim 15, further comprising:

a third switch circuit that is coupled between a third output of the current mirror and a second capacitor node, wherein the oscillator circuit is further arranged for operation with a second capacitor coupled between the second capacitor node and the ground node; and a fourth switch circuit that is coupled between the second capacitor node and the ground node, wherein the switch control circuit further includes:

a second comparator, wherein the second comparator has at least a first input, a second input, and an output; the second comparator is operable to provide a second comparator output signal at the output of the second comparator; the first input of the second comparator is coupled to the second capacitor node; the second input of the second comparator is coupled to the resistor node; and wherein the switch control circuit is further operable to control opening and closing of the third switch circuit and the fourth switch circuit; and a latch that is coupled to the output of the first comparator and the output of the second comparator, wherein the latch is operable to provide the oscillator output signal based on the first comparator output signal and the second comparator output signal.

* * * * *